(12) United States Patent
Kiryu

(10) Patent No.: US 7,558,996 B2
(45) Date of Patent: Jul. 7, 2009

(54) SYSTEMS AND METHODS FOR IDENTIFYING ERRORS IN LBIST TESTING

(75) Inventor: Naoki Kiryu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 553 days.

(21) Appl. No.: 11/377,119

(22) Filed: Mar. 16, 2006

(65) Prior Publication Data
US 2007/0220383 A1  Sep. 20, 2007

(51) Int. Cl.
G01R 31/28 (2006.01)
(52) U.S. Cl. ...................................... 714/726
(58) Field of Classification Search ................ 714/726, 714/728, 729, 731, 732
See application file for complete search history.

(56) References Cited

U.S. PATENT DOCUMENTS 6,807,645 B2   10/2004  Angelotti et al.
7,058,869 B2 *  6/2006  Abdel-Hafez et al. ....... 714/729
7,188,286 B2 *  3/2007  Dervisoglu et al. ......... 714/727

OTHER PUBLICATIONS

"Signature Based Diagnosis for Logic BIST" by Cheng et al. Test Conference, 2006. ITC '06. IEEE International Publication Date: Oct. 2006 On pp. 1-9 ISSN: 1089-3539 ISBN: 1-4244-0292-1 INSPEC Accession No. 9297824.*

"Design and implementation of an new Built-In Self-Test boundary scan architecture" by El-Mahlawy Microelectronics, 2003. ICM 2003. Proceedings of the 15th International Conference on Publication Date: Dec. 9-11, 2003 On pp. 27-31 ISBN: 977-05-2010-1 INSPEC Accession No. 8024564.*

* cited by examiner

Primary Examiner—Cynthia Britt
(74) Attorney, Agent, or Firm—Law Offices of Mark L. Berrier

(57) ABSTRACT

Systems and methods for controlling the execution of LBIST test cycles to allow identification of errors in bit patterns produced by the functional logic of a device under test. In one embodiment, an LBIST controller enables continuous execution of LBIST test cycles (including functional and scan shift phases) prior to a test cycle in which an error arises. In the test cycle in which the error arises, the controller allows execution of the functional phase, but not the following scan shift phase. The computed bit patterns captured in the scan chains are thereby retained in the scan chains, rather than being accumulated into a single MISR signature value. The computed bit patterns can then be retrieved from the scan chains (e.g., via a JTAG chain) and examined to determine the exact location of the error.

17 Claims, 9 Drawing Sheets

SYSTEMS AND METHODS FOR IDENTIFYING ERRORS IN LBIST TESTING

BACKGROUND

1. Field of the Invention

The invention relates generally to the testing of electronic circuits, and more particularly to systems and methods for controlling the execution of LBIST test cycles to allow identification of errors in bit patterns produced by the functional logic of a device under test.

2. Related Art

Digital devices are becoming increasingly complex. As the complexity of these devices increases, there are more and more chances for defects that may impair or impede proper operation of the devices. The testing of these devices is therefore becoming increasingly important.

Testing of a device may be important at various stages, including in the design of the device, in the manufacturing of the device, and in the operation of the device. Testing at the design stage ensures that the design is conceptually sound. Testing during the manufacturing stage may be performed to ensure that the timing, proper operation and performance of the device are as expected. Finally, after the device is manufactured, it may be necessary to test the device at normal operating speeds to ensure that it continues to operate properly during normal usage.

One way to test for defects in a logic circuit is to use a non-deterministic approach in which pseudorandom input test patterns are applied to the inputs of the logic circuit. The outputs of the logic circuit are then compared to the outputs generated in response to the same pseudorandom input test patterns by a logic circuit that is known to operate properly. If the outputs are the same, there is a high probability that the logic circuit being tested also operates properly. The more input test patterns that are applied to the logic circuits, and the more random the input test patterns, the greater the probability that the logic circuit under test will operate properly in response to any given input pattern.

One test mechanism that can be used to implement a non-deterministic testing approach is a built-in self test (BIST). This may also be referred to as a logic built-in self test (LBIST) when applied to logic circuits. BIST and LBIST methodologies are part of a group of methodologies referred to as design-for-test (DFT) methodologies. DFT methodologies impact the actual designs of the circuits that are to be tested. LBIST methodologies in particular involve incorporating circuit components into the design of the circuit to be tested, where the additional circuit components are used for purposes of testing the operation of the circuit's logic gates.

In a typical LBIST system, LBIST circuitry within a device under test includes a plurality of scan chains interposed between levels of the functional logic of the device. Typically, pseudorandom patterns of bits are generated and stored in the scan chains. This may be referred to as scanning the data into the scan chains. After a pseudorandom bit pattern is scanned into a scan chain, the data is propagated through the functional logic to a subsequent scan chain. The data is then scanned output of the subsequent scan chain and accumulated to form a single LBIST signature. This test cycle is typically repeated many times (e.g., 10,000 iterations,) with the results of each test cycle being accumulated into the LBIST signature. After all of the scheduled test cycles have been completed, the LBIST signature is compared to an LBIST signature generated by a device that is known to operate properly. Based upon this comparison, it is determined whether the device under test operated properly.

While conventional LBIST implementations are useful to determine whether the device under test operated properly (and can therefore be expected to continue to operate properly,) they typically are not very useful to determine the source of an error that occurs during the test. Because many test cycles are executed and their results accumulated into a single LBIST signature prior to comparison of the signatures of the device under test and the good device, the sources of errors cannot be localized. In more recent LBIST systems, it may be possible to compare LBIST signatures after each test cycle to determine at which test cycle the error occurs.

Even if the LBIST system is capable of stepping through each test cycle, this only identifies the particular test cycle at which the error occurred. There may be many scan chains, each of which includes many more scan latches. The data from all of these scan latches is combined into the LBIST signature at the end of the test cycle, so the signature can indicate that an error has occurred, but not the source of the error.

Another shortcoming of this test-cycle-by-test-cycle approach is that it does not detect some errors. Some errors are dependent, not only upon the specific input bit pattern that is propagated through the functional logic of the device under test, but also upon the history of operation just prior to propagating this bit pattern through the functional logic. For example, a particular sequence of bit patterns may cause the device to experience a very large change in current (large dI/dt,) which may cause the functional logic to behave in a manner which is unexpected. While the execution of the LBIST test at speed may cause the device to experience an error, performing the LBIST test in a step-by-step fashion may actually reduce the magnitude of the change in current, thereby avoiding the error.

It would therefore be desirable to provide systems and methods for performing LBIST testing that enable the identification of these types of errors that appear in at-speed LBIST testing, but not step-by-step testing, and allow localization of the errors to the test cycles in which they occur and examination of the bit patterns in the scan chains to identify the sources of the errors.

SUMMARY OF THE INVENTION

One or more of the problems outlined above may be solved by the various embodiments of the invention. Broadly speaking, the invention includes systems and methods for controlling the execution of LBIST test cycles to allow identification of errors in bit patterns produced by the functional logic of a device under test. In one embodiment, an LBIST controller enables continuous execution of LBIST test cycles (including functional and scan shift phases) prior to a test cycle in which an error arises. In the test cycle in which the error arises, the controller allows execution of the functional phase, but not the following scan shift phase. The computed bit patterns captured in the scan chains are thereby retained in the scan chains, rather than being accumulated into a single MISR signature value. The computed bit patterns can then be retrieved from the scan chains (e.g., via a JTAG chain) and examined to determine the exact location of the error.

One embodiment comprises a method implemented in a device under test, where the device has multiple scan chains interposed with functional logic of the device. The method includes scanning input bit patterns into the scan chains and then performing a first set of M−1 LBIST test cycles. Each of these test cycles includes a functional phase in which the input bit patterns are propagated through the functional logic, followed by a scan shift phase in which resulting bit patterns captured in the scan chains are shifted out of the scan chains and accumulated in a MISR. In an Mth LBIST test cycle, the shifting of the captured bit patterns from the scan chains into the MISR is inhibited. The bit patterns captured in the scan chains following the functional phase of the Mth test cycle can then be exported from the scan chains to a memory external to the device, where they can be examined to identify the error in the bit patterns.

In one embodiment, the method includes first determining that an error occurred, e.g., by performing a predetermined number of LBIST test cycles, comparing the MISR signatures generated by the device under test and a good device, and determining whether the signatures match. If the signatures do not match, the test cycle in which the error occurs can be determined by selecting a number of test cycles to be executed, executing this many test cycles, checking to see if the MISR signatures match, and repeating this process with different numbers of test cycles until it is determined in which test cycle the error first appears. The search for the test cycle in which the error arises may, in one embodiment, be a binary search.

An alternative embodiment comprises a system including a device under test having LBIST circuitry therein. The LBIST circuitry includes a plurality of scan chains interposed with the functional logic of the device and an LBIST controller. The LBIST controller is configured to control the LBIST circuitry to successively execute a first set of M−1 LBIST test cycles. Each of these test cycles includes a functional phase followed by a scan shift phase. In the scan shift phase, output bit patterns are scanned out of the scan chains and into a MISR. The LBIST controller then causes the execution of an Mth test cycle in which input bit patterns are propagated through the functional logic in the functional phase, but in the scan shift phase the output bit patterns are not accumulated into a MISR signature. The output bit patterns instead are exported from the scan chains. The LBIST controller may be configured to execute a complete LBIST test to determine whether or not any errors occur, and to identify the test cycle in which an error occurs prior to performing the testing which results in the export of the output bit patterns.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
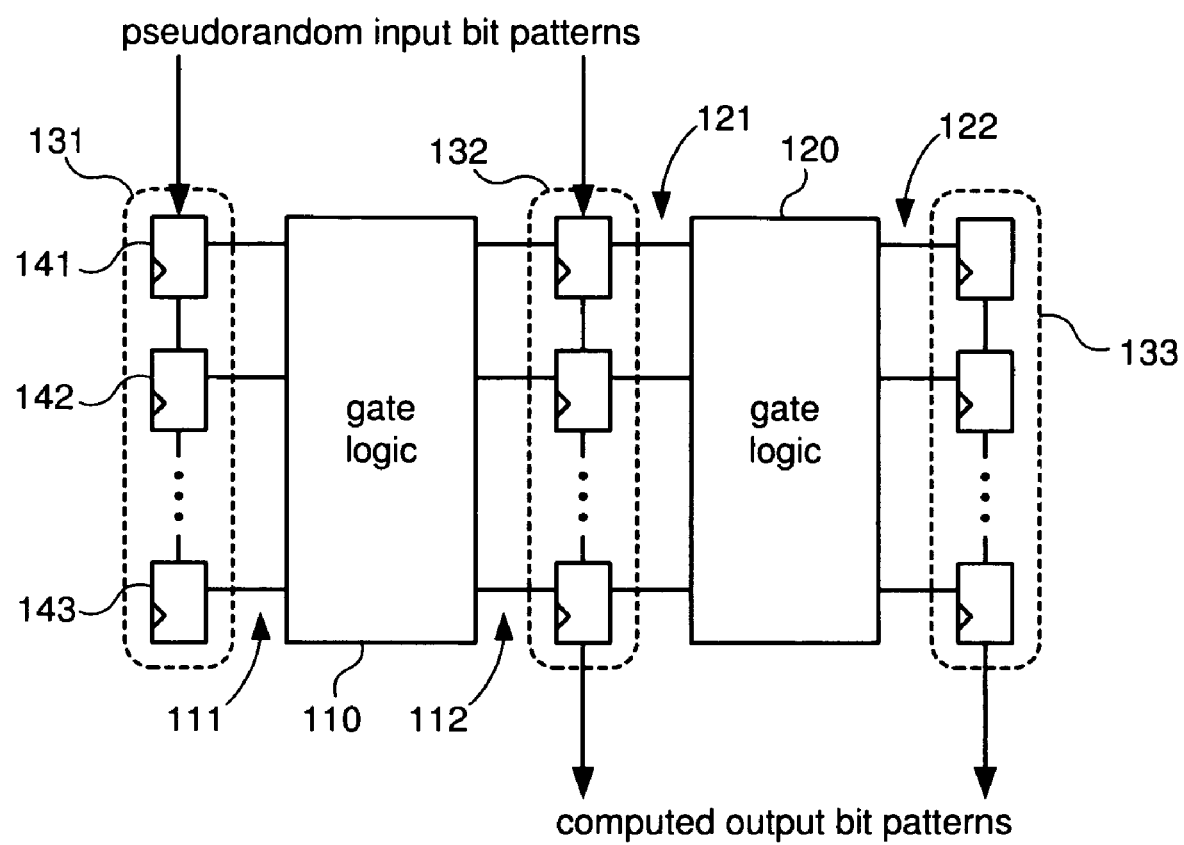
FIG. 1 is a functional block diagram illustrating the principal operation of a simple STUMPS LBIST system.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for controlling the execution of LBIST test cycles to allow identification of errors in bit patterns produced by the functional logic of a device under test. In particular, these systems and methods enable normal execution of LBIST test cycles prior to a test cycle in which an error arises, and execution of a functional phase, but not a subsequent scan shift phase, of the test cycle in which the error arises, thereby allowing errors that are dependent upon a history effect to be identified and localized.

In one embodiment, a STUMPS-type LBIST test architecture is incorporated into the design of a logic circuit. The LBIST components include a set of scan chains interposed between portions of the functional logic of the logic circuit. Pseudorandom bit patterns are scanned into the scan chains so that the pseudorandom bit patterns can be propagated through the functional logic following the scan chains. The resulting bit patterns are captured in scan chains following the functional logic and then are typically scanned out of these scan chains and accumulated into a single MISR signature. In one embodiment, LBIST testing is performed in parallel on a logic circuit under test and a logic circuit that is known to operate properly (a "good" logic circuit.) After a predetermined number of test cycles, the MISR signatures of both logic circuits are compared to determine whether an error occurred in the operation of the circuit under test.

If the error is one which is subject to history effects, it cannot be detected by simply stepping through each test cycle and comparing the MISR signatures after each cycle. The present systems and methods therefore identify the test cycle in which the error occurs, then consecutively execute the LBIST test cycles prior to the one in which the error occurs and execute the final test cycle without scanning the computed bit patterns into the MISR's. This is accomplished in one embodiment by inhibiting a scan enable signal in the last test cycle (the test cycle in which the error occurs.) Instead of scanning the computed bit patterns out of a scan chains, these bit patterns are retrieved from the scan chains (e.g., exported via a JTAG port) so that they can be examined to identify the source of the error.

Various embodiments of the invention will be described below. Primarily, these embodiments will focus on implementations of a STUMPS-type LBIST architecture which is implemented within an integrated circuit. It should be noted that these embodiments are intended to be illustrative rather than limiting, and alternative embodiments may be implemented in BIST architectures other than the STUMPS architecture, and may also be implemented in circuits whose components are not strictly limited to logic components (e.g., AND gates, OR gates, and the like). Many such variations will be apparent to persons of ordinary skill in the art of the invention and are intended to be encompassed by the appended claims.

Referring to FIG. 1 a functional block diagram illustrating the principal operation of a simple LBIST system is shown. The LBIST system is incorporated into an integrated circuit. In this figure, the functional logic of the integrated circuit includes a first portion 110 and a second portion 120. Functional logic 110 is, itself, a logic circuit having a plurality of inputs 111 and a plurality of outputs 112. Similarly, functional logic 120 forms a logic circuit having a plurality of inputs 121 and a plurality and outputs 122. Functional logic 110 is coupled to functional logic 120 so that, in normal operation, outputs 112 of functional logic 110 serve as inputs 121 to functional logic 120.

Each of the inputs to, and outputs from, functional logic 110 and 120 is coupled to a scan latch. The set of scan latches 131 that are coupled to inputs 111 of functional logic 110 forms one is referred to as a scan chain. The latches are serially coupled together so that bits of data can be shifted through the latches of a scan chain. For example, a bit may be scanned into latch 141, then shifted into latch 142, and so on, until it reaches latch 143. More specifically, as this bit is shifted from latch 141 into latch 142, a second bit is shifted into latch 141. As a bit is shifted out of each latch, another bit is shifted into the latch. In this manner, a series of data bits can be shifted, or scanned, into the set of latches in scan chain 131, so that each latch stores a corresponding bit. Data can likewise be scanned into the latches of scan chain 132.

Just as data can be scanned into the latches of a scan chain (e.g., 131,) data can be scanned out of the latches of a scan chain. As depicted in FIG. 1, the latches of scan chain 132 are coupled to the outputs of functional logic 110. Each of these latches can store a corresponding bit than his output by functional logic 110. After these output bits are stored in the latches of scan chain 132, the output data bits can be shifted through the series of latches and provided as an output bit stream. Data can likewise be scanned out of the latches of scan chain 133. It should be noted that the structure illustrated in FIG. 1 does not show data being scanned into scan chain 133, or data being scanned out of scan chain 131. Alternative embodiments may be configured to scan data in and out of these scan chains.

The LBIST system of FIG. 1 operates basically as follows. Pseudorandom bit patterns are generated and are scanned into the scan chains (131, 132) that are coupled to the inputs of functional logic 110 and 120. The pseudorandom bit patterns that are stored in scan chains 131 and 132 are then propagated through the corresponding functional logic. That is, the bit pattern in scan chain 131 is propagated through functional logic 110, while the bit pattern in scan chain 132 is propagated through functional logic 120. Functional logic 110 and 120 process the inputs and generate a corresponding set of outputs. These outputs are captured (stored) in the scan chains (132 and 133) that are coupled to the outputs of the functional logic. The output bit patterns stored in scan chains 132 and 133 are then scanned out of these scan chains.

Figure 2:
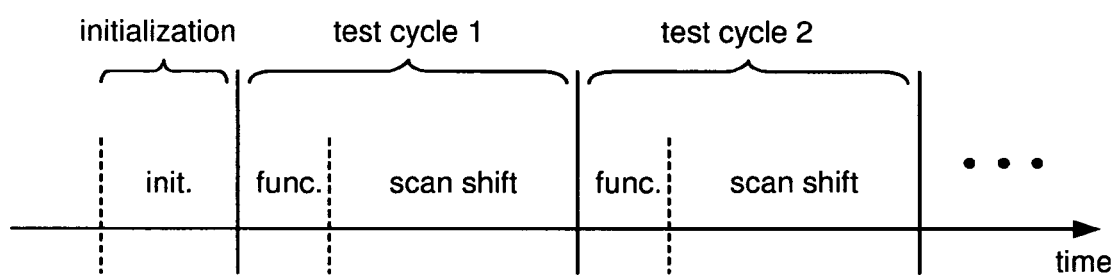
FIG. 2 is a diagram illustrating the phases of operation of the LBIST system in accordance with one embodiment.

Referring to FIG. 2, a diagram illustrating the phases of operation of the LBIST system in accordance with one embodiment is shown. FIG. 2 shows three different phases of operation of the LBIST system: initialization; function; and scan shift. In the initialization phase, the various components of the system are prepared for normal operation. This may include resetting various components, providing a seed for a pseudorandom number generator, setting values in registers, and so on. In the function phase, data is propagated through the functional logic of the device in which the LBIST system is implemented. In the scan shift phase, data is scanned into and out of the scan chains of the LBIST system.

As a shown in figure, operation of the LBIST system begins with the initialization phase. As noted above, the system is prepared for normal operation during this phase. The various components of the system are prepared for operation during this phase. As will be discussed in more detail, several counters, including a mode counter and a cycle counter, are reset. It may be necessary to ensure that several registers (e.g., function register, scan register) have the appropriate values stored therein, as will also be discussed below. Because, as depicted in FIG. 2, each test cycle begins with a function phase, it is also necessary in the initialization phase to generate a first set of pseudorandom bit patterns and to load these bit patterns into the scan chains that are interposed between the functional logic of the device under test. After these operations are performed, the LBIST system is ready for execution of the test cycles.

Following the initialization phase, the LBIST system begins a first test cycle that includes a functional phase and a scan shift phase. During the functional phase, the data that was scanned into the scan chains is propagated through the functional logic of the device under test. At the end of this functional phase, the output of the functional logic is captured by the scan chains. As noted above, a scan chain that is positioned between successive functional logic blocks serves to both provide inputs to one of the functional logic blocks and capture the outputs of the other of the functional logic blocks. The data that is captured in the scan chains at the end of the functional phase is scanned out of the scan chains during the scan shift phase. At the same time the captured data is scanned out of the scan chains, new pseudorandom bit patterns are scanned into the scan chains to prepare for the functional phase of the next test cycle. The system then proceeds to execute test cycle 2, then test cycle 3, and so on, until all of the test cycles for the LBIST test have been completed. As noted above, the LBIST test may include many (e.g., several thousand) test cycles.

As the data captured in the scan chains at the end of the functional phase is scanned out of the scan chains, it is accumulated in a multiple input signature register (MISR.) The signature data in this register is modified by the data scanned out of the scan chains at the end of each test cycle. After all of the test cycles are completed, the signature value in the MISR can then be compared to expected data. The expected data may, for example, comprise signature data in the MISR of an identical device (a "good" device) that is running in parallel with the device under test. If the signatures match, the device under test is operating properly. If the signatures do not match, the device under test has malfunctioned.

As noted above, it is desired to localize the source of errors that don't necessarily arise when the LBIST test cycles are executed, and the resulting MISR signatures examined, one at a time. The present systems and methods therefore enable the execution of successive LBIST test cycles until the test cycle in which an error arises, and then inhibit the scanning of the computed bit patterns containing the error into the MISR of the device under test. The computed bit patterns are instead exported from the latches of the scan chains via a JTAG scan chain or some similar mechanism to an external memory or similar storage device so that they can be examined to determine the source of the error. Various embodiments may also include systems and methods for identifying the test cycle in which the error arises.

Figure 3:
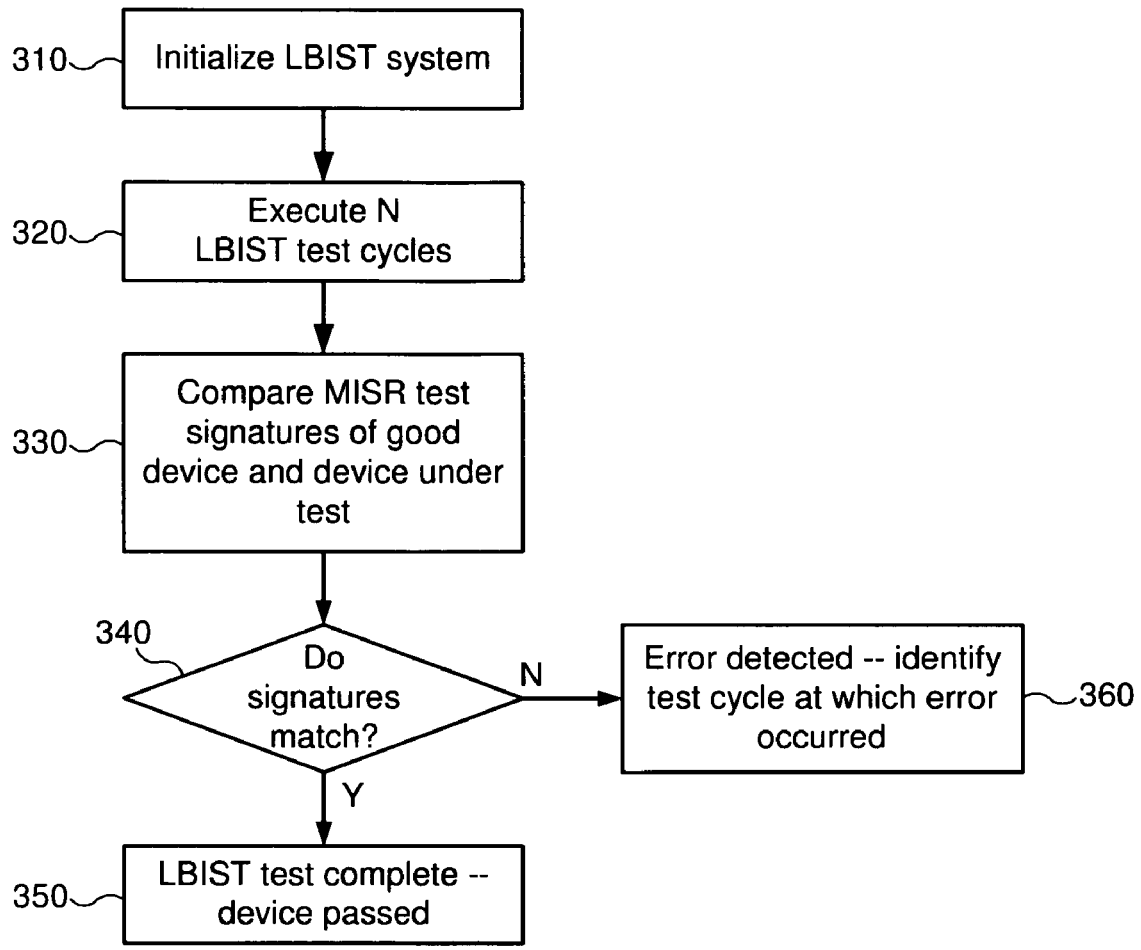
FIG. 3 is a flow diagram illustrating a process by which it is determined whether an error occurs in the operation of a device under test in accordance with one embodiment.
Figure 4:
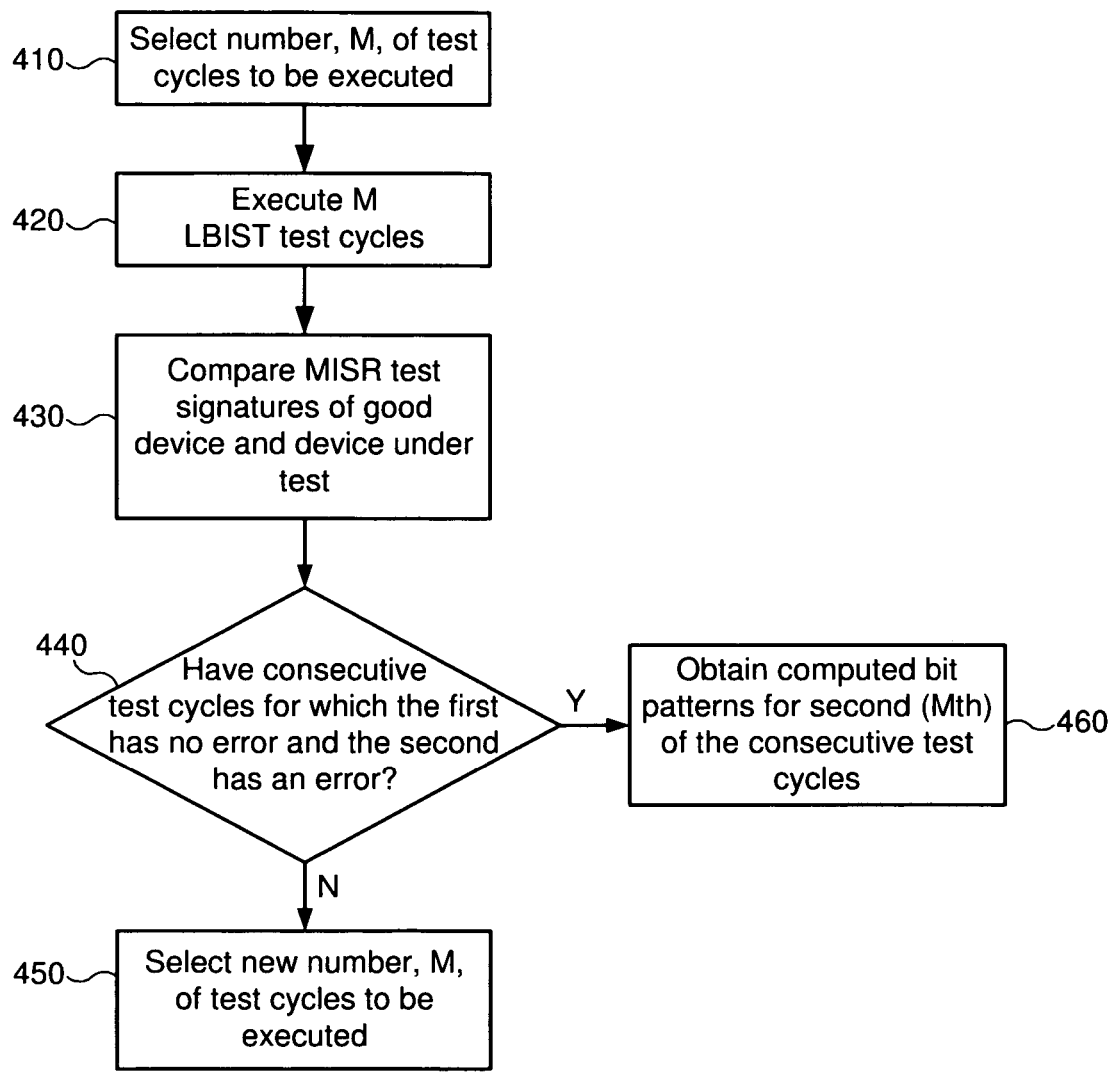
FIG. 4 is a flow diagram illustrating a process by which a test cycle in which an error occurs is identified in accordance with one embodiment.
Figure 5:
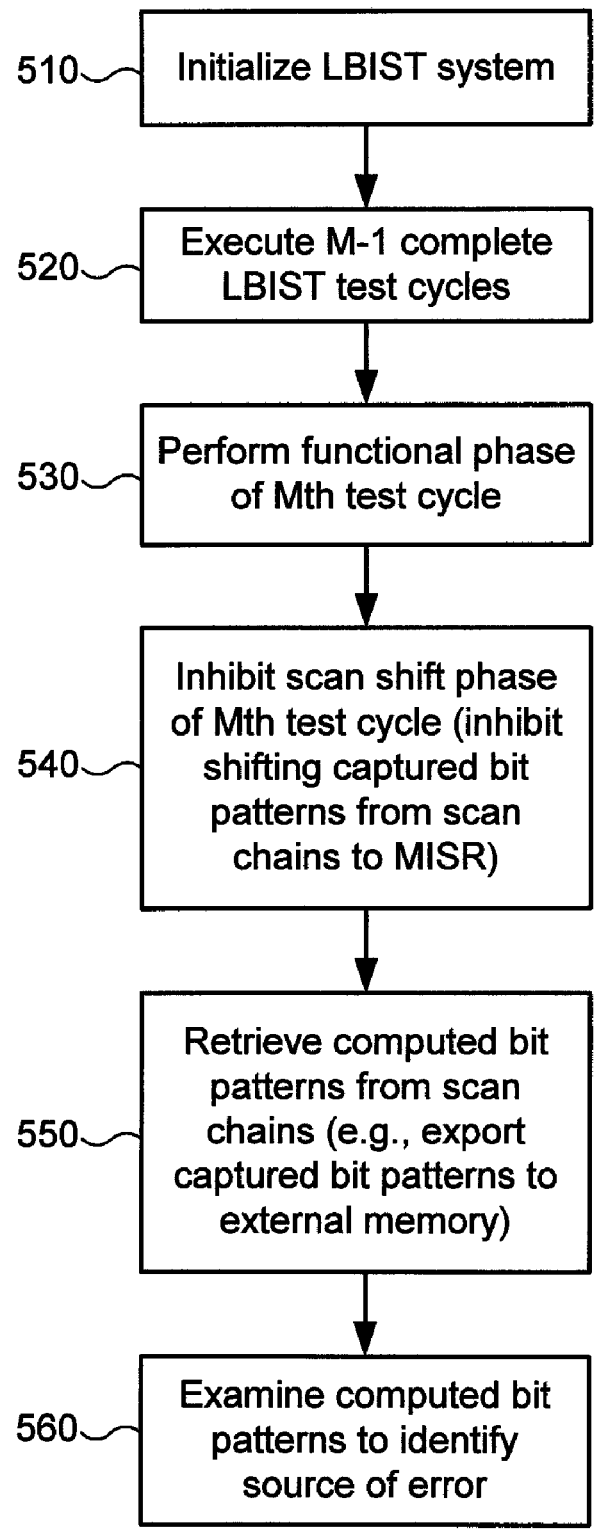
FIG. 5 is a flow diagram illustrating a process by LBIST test cycles are executed in order to obtain computed patterns from the scan chains of an LBIST system in accordance with one embodiment.

The operation of an exemplary LBIST system is summarized in FIGS. 3 and 4. In this system, it is first determined whether an error occurs during a complete LBIST test, then the error (if one is detected) is localized to a particular test cycle, and the computed bit pattern containing the error is retrieved so that it can be examined. FIG. 3 is a flow diagram illustrating the determination of whether an error occurs during LBIST testing in accordance with one embodiment. FIG. 4 is a flow diagram illustrating the localization of the error to a particular test cycle in accordance with this embodiment. FIG. 5 is a flow diagram illustrating the execution of test cycles preceding the test cycle in which the error arises, and the retrieval of the computed bit patterns containing the error.

Referring to FIG. 3, operation of the system begins with the initialization of the LBIST components (block 310.) (It should be noted that, in this embodiment, the LBIST systems of a device under test and a known good device are run in parallel so that they can be compared.) Because the system begins each test cycle with a functional phase, input bit patterns are scanned into the latches of the scan chains as part of the initialization process. The system then executes a predetermined number (e.g., 10,000) of test cycles (block 320.) In each test cycle, the system executes a functional phase, including propagating data from the scan chains through the functional logic and capturing the resulting bit patterns in the scan chains. Following the functional phase, the system executes the scan shift phase in which the captured bit patterns are scanned out of the scan chains and new pseudorandom bit patterns are scanned into the scan chains. The data which is scanned out of the scan chains is accumulated in a MISR to produce a single MISR signature value.

After the predetermined number of test cycles has been completed, the MISR signature of the device under test is compared to the MISR signature of the good device (block 330.) It is determined from this comparison whether the two MISR signatures match. If the two MISR signatures match (block 340,) the device under test has experienced no errors, and the LBIST test is complete (block 350.) If, however, the two MISR signatures do not match, the two devices did not operate identically, so it is assumed that an error arose in the operation of the device under test. It is therefore necessary to determine the test cycle in which the error arose (block 360.)

FIG. 4 is a flow diagram illustrating a method in accordance with one embodiment for identifying the test cycle in which the error causing the mismatch of the MISR signatures arose. It is assumed, for the purposes of this discussion, that the error is a type that appears during at-speed LBIST testing, but not during step-by-step testing. After the complete LBIST test has been run, and it has been determined that an error has occurred, an intermediate number, M, of test cycles (i.e., a number less than the number in the complete LBIST test) is selected (block 410.) The LBIST system is re-initialized and M test cycles are executed (block 420.) When the M test cycles have been completed, the MISR signature of the device under test is compared to the MISR signature of the good device (block 430.) If the two MISR signatures match, it is known that the error arose in a later test cycle. If the MISR signatures did not match, is known that the error arose in one of the executed test cycles. This process is repeated until two consecutive test cycles are identified in which the MISR signatures resulting from the first of the test cycles manage and the MISR signatures resulting from the second of the test cycles do not match (see blocks 440-450. Then, it is known that the error arose during the second of the identified test cycles, since this is the first time the error appears. Once these two test cycles have been identified, the method proceeds to block 460 seven at the computed pattern containing the error can be obtained.

Referring to FIG. 5, a flow diagram illustrating the method by which the computed pattern is obtained in this embodiment is shown. As described above, it has been determined at this point that the error arose in a test cycle that is identified as cycle M in FIG. 5. Thus, the MISR signatures of the device under test and that could device matched through test cycle M−1, but did not match at the completion of test cycle M. The LBIST system is re-initialized (block 510) and configured to execute each test cycle through cycle M−1 normally (block 520.) That is, in each of these test cycles, the LBIST system executes a functional phase, followed by a scan shift phase during which the computed patterns are accumulated in the respective MISR's of the device under test and the good device. The LBIST system than executes the functional phase of test cycle M (block 530,) but inhibits the scan shift phase of this test cycle (block 540.) As a result, the computed bit pattern generated by propagating the input bit patterns through the functional logic remain in the latches of the scan chains, rather than being combined with the existing MISR signature. The computed bit patterns are retrieved from the scan chains in this embodiment via JTAG chains (block 550.) The JTAG chains incorporate the scan chains of the devices and thereby enable a user to shift all of the computed bit patterns out of the devices in respective serial bitstreams. The computed bit patterns of the device under test and the good device can then be compared to identify the error (block 560.)

It should be noted that the particular number of test cycles to be executed (see blocks 410, 450) can be selected in a variety of ways. It is contemplated that one of the most efficient ways to do so is to choose numbers corresponding to a binary search. As noted above, the goal of the process depicted in FIG. 4 is to determine in which test cycle the error arises. In each iteration, the selected number of test cycles is executed and it is determined whether the error arises before or after execution of this number of test cycles. In a binary search, the number of test cycles to be executed in any given iteration of the process is selected to reduce by half the number of test cycles in which the error may arise. In other words, if there are N test cycles in the entire LBIST test, N/2 test cycles are chosen for the first iteration of FIG. 4. If, after execution of N/2 test cycles, the MISR signatures do not match, it is known that the error arose prior to the (N/2)th test cycle. If the MISR signatures match, the error arose after the (N/2)th test cycle. The next number of test cycles to be executed is selected as the mid-point of the remaining possibilities, and so on, until the test cycle in which the error arises is identified.

It should be noted that while the embodiment depicted in FIG. 4 compares the data generated by the LBIST system in the device under test with corresponding data generated by a good device, alternative embodiments may identify errors in other ways. For example, one alternative embodiment may comparing data generated in the device under test to data that was previously generated by a good device and was then stored in a memory. This data could be retrieved from the memory and compared to the data of the device under test in the same way that data of the good device is compared. Because of the very large amounts of data that would have to be stored, however, this is not believed to be as practical a solution as the comparison to good data that is generated in parallel with the data of the device under test. The "live" comparison also has the advantage of providing as little or as much data as is needed. For instance, the live comparison could continue to provide data for LBIST tests that continued for an indefinite period of time.

Figure 6A:
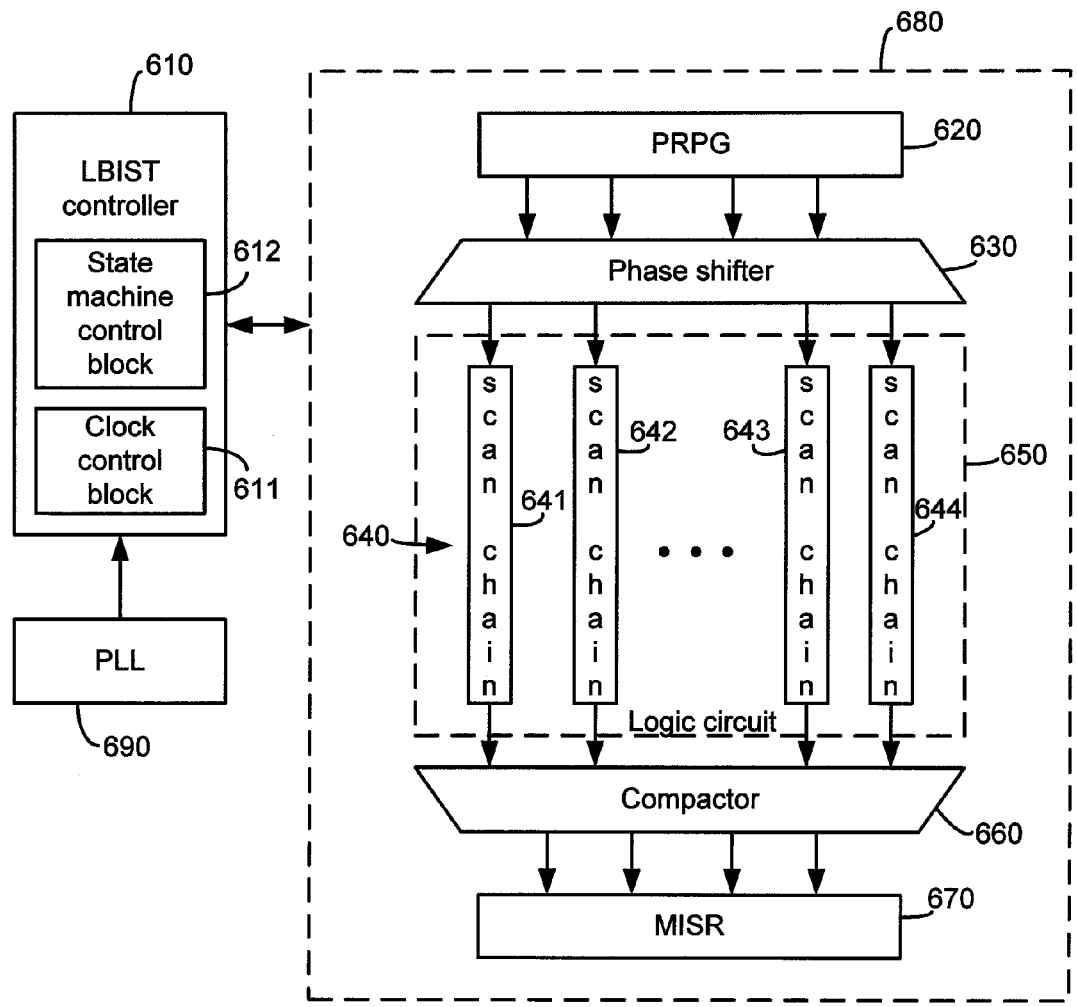
FIG. 6A is a functional block diagram illustrating an LBIST architecture that can be used in conjunction with the testing of large-scale logic circuits in accordance with one embodiment.

In one embodiment, the LBIST system is implemented as shown in the functional block diagram of FIG. 6A. As depicted in FIG. 6A the LBIST system comprises a STUMPS architecture that includes an LBIST controller 610, a PRPG 620, a phase shifter 630, a set of scan chains 640, a compacter 660 and a MISR 670. These LBIST components are integrated with a logic circuit 650, which the LBIST components are designed to test. (It should be noted that, while only four scan chains are depicted in FIG. 6A there may be many scan chains in the LBIST design.)

LBIST controller 610 includes control circuitry that controls the operation of the remainder of the LBIST components 680. (For purposes of clarity, LBIST controller 610 is depicted as being coupled to LBIST components 680 as a group, although the controller is typically coupled directly to each of the components.)

One of the functions of LBIST controller 610 is to provide a seed value to PRPG 620. Based upon this seed value, PRPG 620 generates a pseudorandom sequence of bits that are processed by phase shifter 630 and loaded into scan chains 640. PRPG 620 can be implemented as a linear feedback shift register (LFSR). The purpose of the pseudorandom sequence of bits generated by PRPG 620 is to provide a set of input bits to be propagated through the functional logic components of logic circuit 650. The pseudorandom sequence is therefore provided to each of the scan chains 640. It should be noted, however, that in this embodiment the pseudorandom bit sequence is loaded into scan chains 640 only after being processed by phase shifter 630.

The purpose of phase shifter 630 is to make the character of the bit sequence is loaded into scan chains 640 more random. When a LFSR is used to generate the pseudorandom bit pattern to be shifted into the scan chains, the sequence in each successive column may be identical to the sequence in the preceding column, except that the sequence is shifted down by one bit. Thus, there is a clearly identifiable pattern within the "random" sequences of bits. Phase shifter 630 shifts the phase of the pseudorandom sequence of bits so that no such pattern is identifiable within the succeeding bit sequences. Essentially, phase shifter 630 operates by shifting the phase of each succeeding column with respect to the preceding column. In other words, rather than being offset by a single bit in each succeeding column, the bit patterns in succeeding columns are shifted by different amounts. While not essential to the test architecture, phase shifter 630 therefore improves the operation of the test circuitry.

The pseudorandom bit patterns that are generated by PRPG 620 and phase shifter 630 are loaded into scan chains 640. Each of scan chains 640 comprises a series of scan latches that are configured to alternately shift data (the pseudorandom bit patterns or functional logic output) through the scan chains or to hold data that has been propagated through the functional logic. As indicated above, a separate sequence is loaded into each of scan chains 640. Each of scan chains 640 is positioned before or after (interposed with) respective portions of logic circuit 650. Thus, for each portion of logic circuit 650, there is a scan chain which precedes this portion and provides inputs to the corresponding logic, as well as a scan chain which follows this portion and receives the output of the corresponding logic. For example, one portion of logic circuit 650 may receive input bits from scan chain 641 and provide output bits to scan chain 642. Another portion of logic circuit 650 may receive input bits from scan chain 643 and provide output bits to scan chain 644. Some of scan chains 640 may serve both to provide input bits to a succeeding portion of logic circuit 650 and to receive output bits from a preceding portion of logic circuit 650.

After the pseudorandom bit patterns have been allowed to propagate through the functional components of logic circuit 650 and the results have been captured in scan chains 640, the contents of scan chains 640 are scanned out of the scan chains (i.e., they are unloaded from the scan chains) to compactor 660 and MISR 670. The purpose of compactor 660 is simply to reduce the number of bits that have to be handled by MISR 670. Compactor 660 may be implemented in a number of ways. Typically, compactor 660 will employ a series of XOR gates, where the output of each XOR gate is based upon inputs received from a pair of scan chains. The number of bits that are then passed to MISR 670 can therefore be reduced by a factor of 2. In alternative environments, more complex circuitry may allow the number of bits to be reduced by an even greater factor.

When the bits from scan chains 640 have been compacted by compactor 660, they are provided to MISR 670. MISR 670 provides a means to observe the resulting data bits and to compare this information to the expected output of the test system. Typically, MISR 670 enables the observation of a cumulative value that is based upon the output of the scan chains at each cycle. For example, in one embodiment, MISR 670 performs a modulo operation on the output of compactor 660. That is, MISR 670 divides the current value stored in MISR 670 by the output of compactor 660, and retains the remainder from this computation. This computation is performed, and the value stored in MISR 670 is updated, after each functional cycle.

The data stored in MISR 670 can be read out of the device, for instance, via a JTAG port of the device into which the LBIST components are incorporated. ("JTAG" stands for Joint Test Action Group, which is the group that developed this particular type of boundary scan port.) This allows the value stored in MISR 670 to be compared to an expected value. If the stored value does not match the expected value, then one or more of the operations performed by the functional components of logic circuit 650 failed, thereby providing an incorrect data bit in the output scan chain, which then propagated through compactor 660 to MISR 670.

The operation of LBIST components 680 is controlled by LBIST controller 610, which generates the control signals necessary to execute the phases of operation depicted in FIG. 2 (i.e., the initialization, functional and scan shift phases.) The generation of these control signals is performed in this embodiment by clock control block 611 and state machine control block 612, based upon a clock signal generated by PLL 690.

Figure 6B:
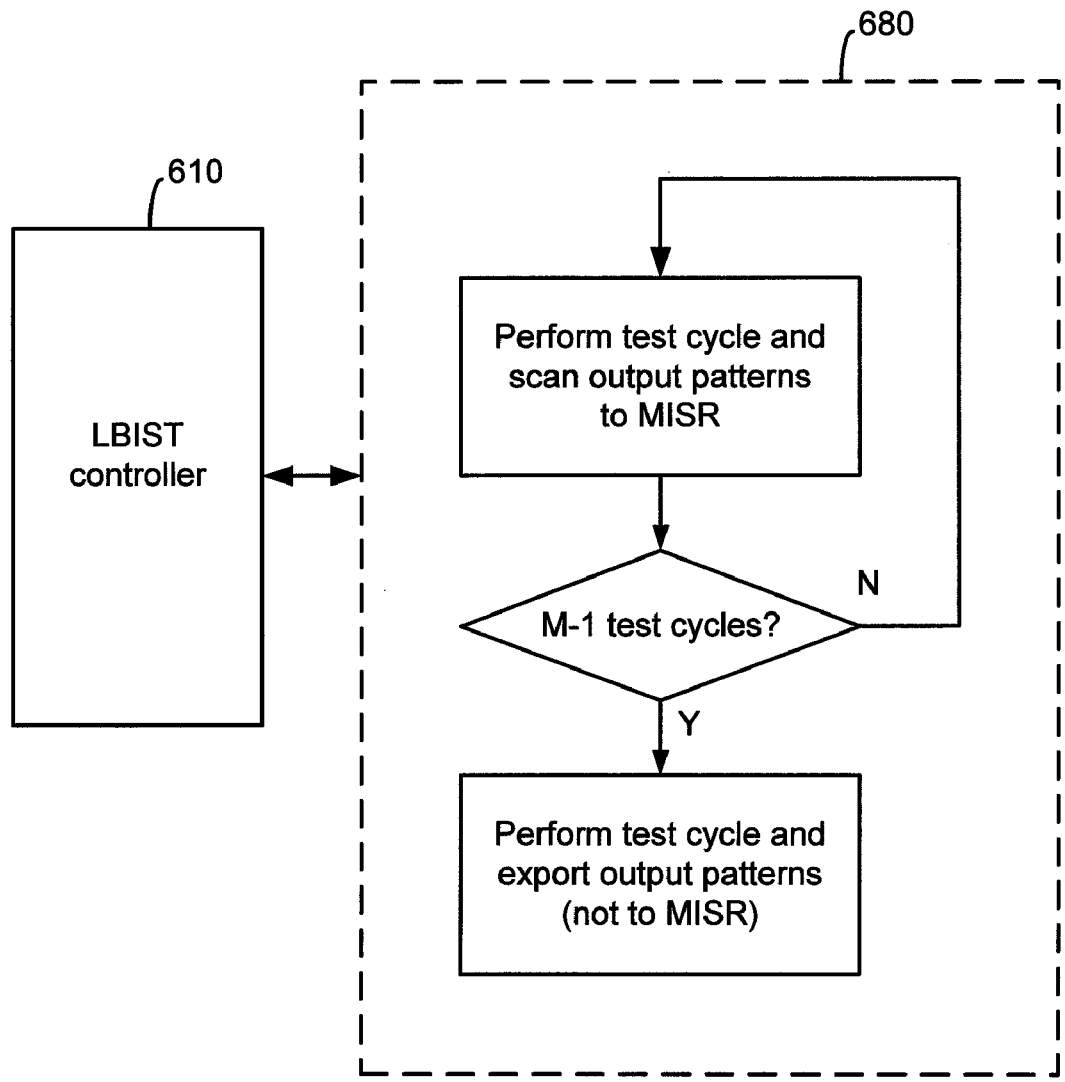
FIG. 6B is a block diagram illustrating the execution of a series of test cycles in an LBIST architecture in accordance with one embodiment.

As noted above, a system such as is shown in FIG. 6A may be configured so that the LBIST controller controls the LBIST circuitry to successively execute a first set of M−1 LBIST test cycles in which a functional phase is followed by a scan shift phase. In the scan shift phase, output bit patterns are scanned out of the scan chains and into a MISR. The LBIST controller then causes the execution of an Mth test cycle in which input bit patterns are propagated through the functional logic in the functional phase, but in the scan shift phase the output bit patterns are exported from the scan chains instead of being accumulated into a MISR signature. This is illustrated in FIG. 6B.

Figure 7:
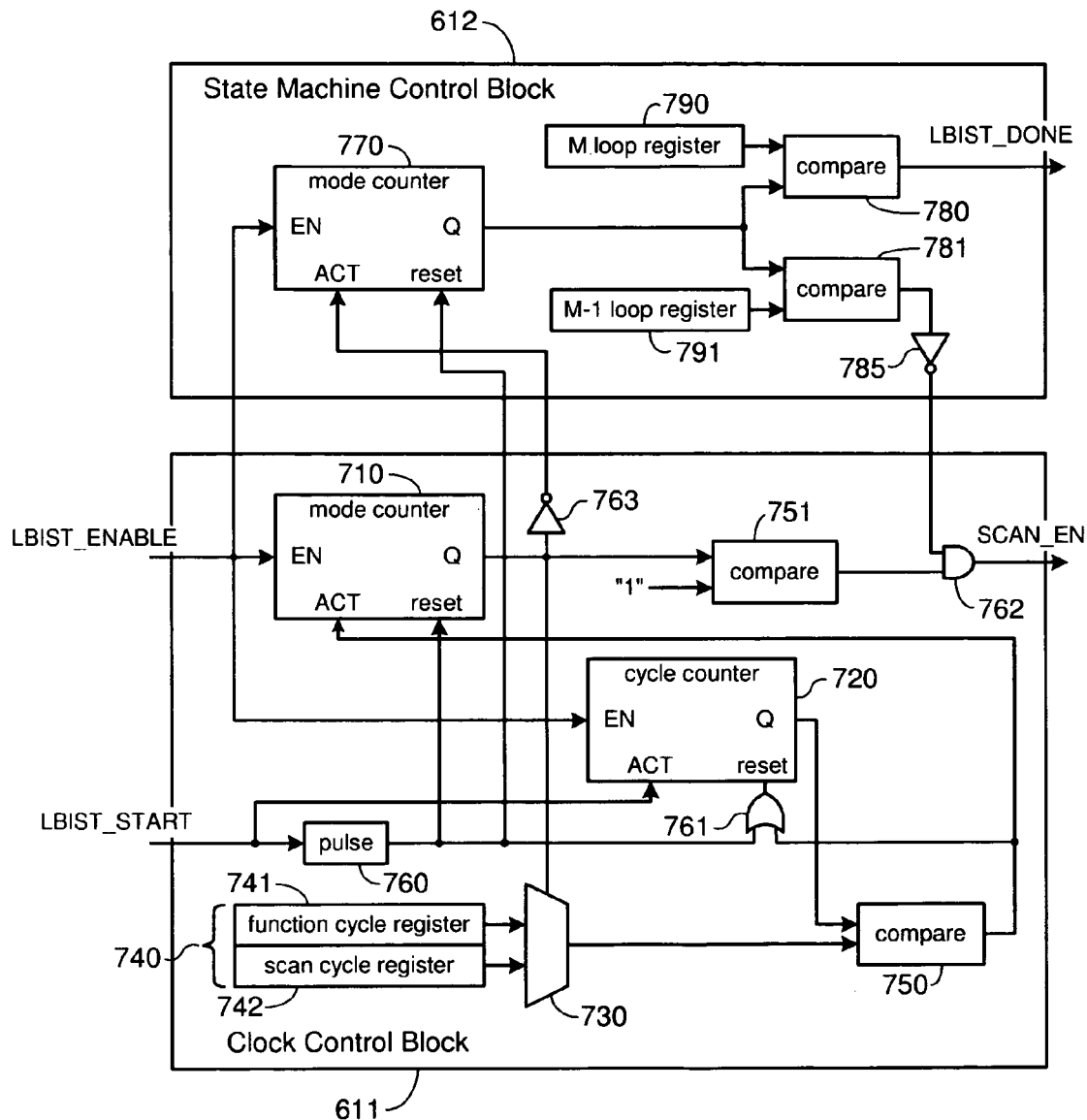
FIG. 7 is a functional block diagram illustrating the structure of a state machine control block and a clock control block in accordance with one embodiment.

Referring to FIG. 7, a functional block diagram providing additional detail in regard to the structure of clock control block 611 and state machine control block 612 in one embodiment is shown. As depicted in this figure, clock control block 611 includes a binary mode counter 710, a LFSR cycle counter 720, a register selector 730, a mode cycle register 740, comparators 750-752, pulse generator 760, OR gate 761 and AND gate 762. State machine control block 612 includes a loop counter 770, comparators 780 and 781, registers 790 and 791, and an inverter 785. It should be noted that FIG. 7 depicts the components of the LBIST that are relevant to the operation of the system as shown in the flow diagram of FIG. 5. The system may include additional components, but they are not shown in FIG. 7 for purposes of clarity.

In this embodiment, Clock control block 611 receives an LBIST_ENABLE signal and a LBIST_START signal, as well as an inverted signal from state machine control block 612. Clock control block 611 generates a SCAN_EN signal, and also provides a mode counter value and reset signal to state machine control block 612.

First, values for M and M−1 are loaded into registers 780 and 781, respectively. The LBIST system will execute M−1 full test cycles and the functional phase of test cycle M. To start the LBIST test, signal LBIST_ENABLE is asserted, and then signal LBIST_START is asserted. LBIST_ENABLE enables counters 710, 720 and 770. LBIST_START is received by pulse generator 760, which generates a reset pulse that is provided to each of counters 710 and 770, and to OR gate 761. The reset pulse resets counters 710 and 770 directly. When OR gate 761 receives the LBIST_START signal, it asserts an output signal that resets counter 720. In addition to being provided to pulse generator 760, LBIST_START is provided to an active input of cycle counter 720 to activate the counter. Cycle counter 720 maintains a count of the cycles in each of the phases of the test cycles.

Mode counter 710, which is initially reset to 0, provides this value to register selector 730. This causes register selector 730 to select the value of function cycle register 741 within mode cycle register 740. This value defines the number of cycles in the functional phase of the test cycle. Typically, there is either a single cycle or two cycles in the functional phase, depending upon whether the shifting of the input bit patterns into the scan chains is completed on the last cycle of the scan shift phase (or the initialization phase,) or on the first cycle of the functional phase. Comparator 750 then compares the value of function cycle register 741 with the output of cycle counter 720.

When the output of cycle counter 720 matches the value of function cycle register 741, the output of comparator 750 is asserted. This signal is provided to OR gate 761 and to the active input of mode counter 710. Assertion of the output of comparator 750 causes the output of OR gate 761 to be asserted, resetting cycle counter 720 to 0. Assertion of the output of comparator 750 also causes mode counter 710 to become active, so that the mode of the LBIST system is incremented from 0 (corresponding to the functional phase of the test cycle) to 1 (corresponding to the scan shift phase of the test cycle.) The new mode value (1) is provided to register selector 740, causing it to select scan cycle register 742. This value defines the number of cycles in the scan shift phase of the test cycle. This value is typically equal to the number of scan latches in each of the scan chains (or one less, depending upon whether the last bit of each input bit patterns is shifted into the scan chains in the scan shift phase or the functional phase. Cycle counter 720 continues to count the number of cycles (this time in the scan shift phase,) and comparator 750 compares the value of scan cycle register 742 with the output of cycle counter 720.

The mode value of mode counter 710 is provided to comparator 751, as well as register selector 730. Comparator 751 compares the received mode value to 1 and provides a resulting output signal to AND gate 762. Thus, when the mode value is 0 (corresponding to a functional phase,) the output of comparator 751 is not asserted. When the mode value is 1 (corresponding to a scan shift phase,) the output of comparator 751 is asserted. AND gate 762 receives a second input from state machine control block 612 which is asserted in all of the test cycles except for the last one, as will be described in more detail below. The output of AND gate 762 is therefore deasserted during each functional phase, and asserted during each scan shift phase except in the last test cycle.

The mode value of mode counter 710 is provided to inverter 763, which then provides the inverted mode value to an active input of Loop counter 770. Loop counter 770 maintains a loop count value representing the test cycle number. Loop counter 770 begins with test cycle 0, and is incremented when the mode value is 0 (during the functional phase of each test cycle.) The loop count of Loop counter 770 is provided to comparators 780 and 781. Comparator 780 compares the loop count to the value (M) stored in register 790, while comparator 781 compares the loop count to the value (M−1) stored in register 791. The output of comparator 780 (the LBIST_DONE signal) is therefore deasserted during each test cycle, and is asserted after completion of the last test cycle. The output of comparator 781 is deasserted during each test cycle except the last (M−1.) The output of comparator 781 is provided to inverter 785, and the output of inverter 785 is provided as the second input to AND gate 762.

Figure 8:
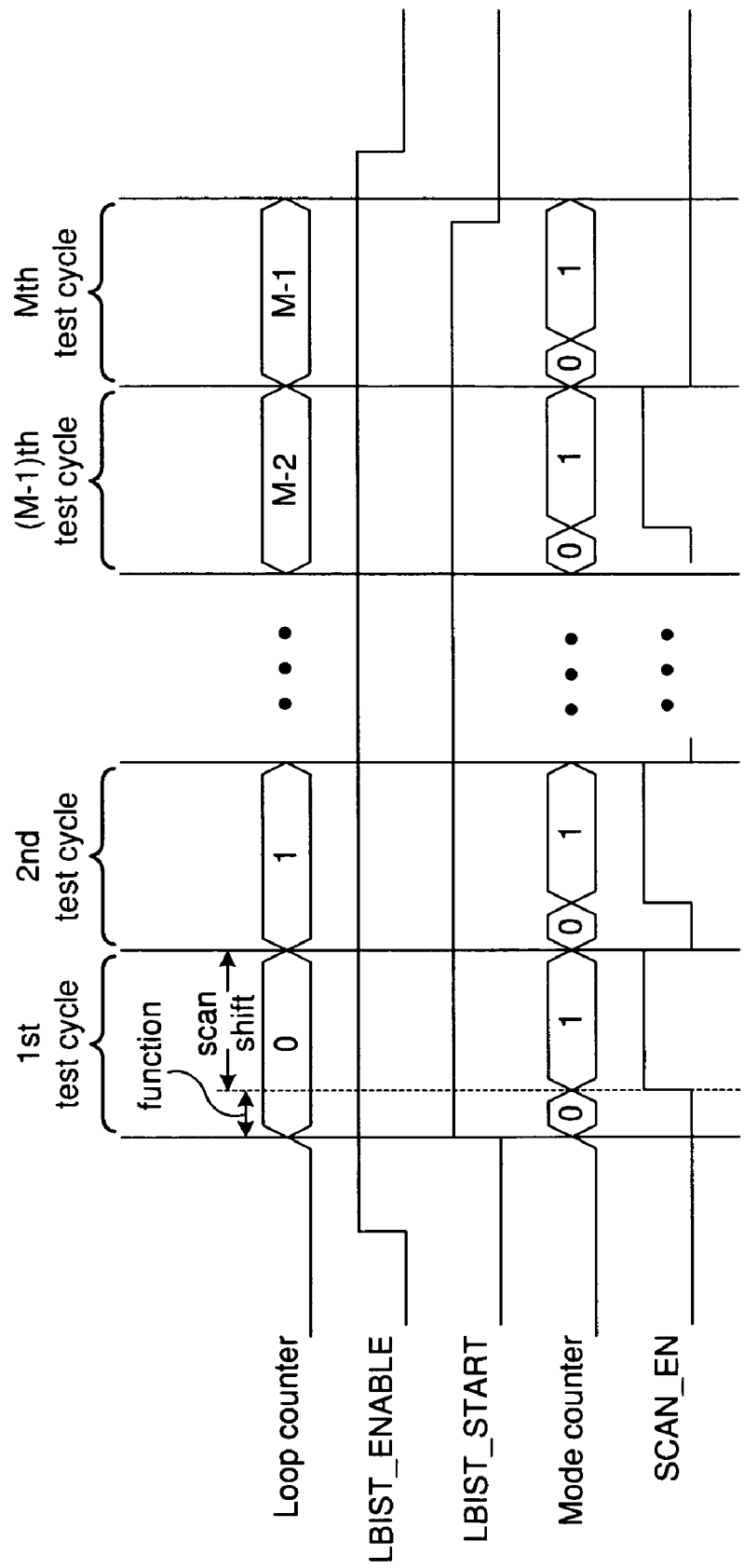
FIG. 8 is a diagram illustrating the timing of control signals generated by the state machine control block and clock control block in accordance with the embodiment of FIG. 7.

Referring to FIG. 8, a timing diagram showing some of the signals pertinent to operation of the system described in connection with FIG. 7 is shown. FIG. 8 depicts input signals LBIST_ENABLE and LBIST_START, and output signals SCAN_EN and LBIST_DONE. Also depicted in the figure are the values maintained by mode counter 710 and loop counter 770.

As shown in FIG. 8, signal LBIST_ENABLE is asserted prior to initiation of the first test cycle and remains asserted until after completion of the last (Mth) test cycle. Signal LBIST_START is deasserted during initialization. When LBIST_START is asserted, the first test cycle is initiated. LBIST_START remains asserted throughout the first M−1 test cycles and is deasserted during the scan shift phase of the Mth test cycle. It can be seen that the mode counter value alternates between 0 and 1, with 0 defining the functional phase and 1 defining the scan shift phase. It can also be seen that, through the first M−1 test cycles, signal SCAN_EN (the output of AND gate 762) is asserted during each scan shift phase and deasserted during each functional phase. SCAN_EN is deasserted throughout the Mth test cycle. This is a result of the fact that the output of comparator 751 (which is high during each scan shift phase) is AND'ed with the inverted output of comparator 781 (which is high during the first M−1 test cycles and low during the Mth test cycle.)

While the foregoing description presents several specific exemplary embodiments, there may be many variations of the described features and components in alternative embodiments. For example, the LBIST controller described above may be used to control the LBIST circuitry in both a device under test and a good device, or a separate LBIST controller may be used in conjunction with each of the devices. Many other variations will also be apparent to persons of skill in the art of the invention upon reading the present disclosure.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in software (program instructions) executed by a processor, or in a combination of the two. Software may reside in RAM memory, flash memory, ROM memory, EPROM memory, EEPROM memory, registers, hard disk, a removable disk, a CD-ROM, or any other form of storage medium known in the art. Such a storage medium containing program instructions that embody one of the present methods is itself an alternative embodiment of the invention. One exemplary storage medium may be coupled to a processor, such that the processor can read information from, and write information to, the storage medium. In the alternative, the storage medium may be integral to the processor.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A method implemented in a device under test having multiple scan chains interposed with functional logic of the device, the method comprising:
    (a) scanning input bit patterns into the scan chains;
    (b) performing a first set of M−1 LBIST test cycles, where M is a positive integer greater than 1, and wherein each of the test cycles in the first set comprises a functional phase in which the input bit patterns are propagated through the functional logic, followed by a scan shift phase in which resulting bit patterns captured in the scan chains are shifted out of the scan chains and accumulated in a MISR;
    (c) in an Mth LBIST test cycle, inhibiting shifting of the captured bit patterns from the scan chains into the MISR;
    (d) exporting the captured bit patterns of the Mth test cycle from the scan chains to a memory external to the device.

2. The method of claim 1, further comprising examining the captured bit patterns to identify an error in the captured bit patterns.

3. The method of claim 1, further comprising identifying the Mth LBIST test cycle as a test cycle in which the error occurs prior to performing (a)-(d).

4. The method of claim 1, further comprising: performing a predetermined number of LBIST test cycles; determining whether the error occurred; in response to determining that the error occurred, identifying the Mth test cycle in which the error occurred, then performing (a)-(d).

5. The method of claim 4, wherein identifying the Mth test cycle in which the error occurred comprises performing a binary search for the test cycle in which the error occurred.

6. The method of claim 4, wherein determining whether the error occurred comprises: performing the predetermined number of LBIST test cycles in the device under test and in an identically configured device which is known to operate properly; and comparing corresponding MISR signatures generated by the device under test and the device which is known to operate properly.

7. The method of claim 1, wherein during the first set of M−1 LBIST test cycles, a scan enable signal is asserted during a scan shift phase of each test cycle, and during the Mth test cycle, the scan enable signal is deasserted during the corresponding scan shift phase.

8. The method of claim 1, wherein examining the captured bit patterns comprises reading the captured bit patterns out of the scan chains.

9. The method of claim 8, wherein reading the captured bit patterns out of the scan chains comprises scanning the captured bit patterns out of the device under test through a test scan chain.

10. A system comprising:
    a first device having functional logic and a plurality of scan chains interposed with the functional logic;
    an LBIST controller coupled to the first device and configured to control the first device to successively execute M−1 LBIST test cycles, where M is a positive integer greater than 1, and wherein each of the test cycles includes a functional phase in which input bit patterns are propagated through the functional logic, followed by a scan shift phase in which input bit patterns are scanned into the scan chains and output bit patterns are scanned out of the scan chains and into a MISR, and execute an Mth test cycle in which input bit patterns are propagated through the functional logic in a corresponding functional phase, and in which output bit patterns are exported from the scan chains to a destination other than the MISR.

11. The system of claim 10, further comprising export circuitry coupled to the scan chains and configured to export the output bit patterns from the first device.

12. The system of claim 10, wherein the LBIST controller is configured to identify the Mth LBIST test cycle as a test cycle in which the error occurs prior to executing the M test cycles.

13. The system of claim 10, wherein the LBIST controller is configured to perform a predetermined number of LBIST test cycles; determine whether the error occurred; in response to determining that the error occurred, and identify the Mth test cycle in which the error occurred, prior to executing the M test cycles.

14. The system of claim 13, wherein the LBIST controller is configured to identify the Mth test cycle in which the error occurred by performing a binary search for the test cycle in which the error occurred.

15. The system of claim 10, wherein the LBIST controller is configured during the M−1 LBIST test cycles to assert a scan enable signal during the scan shift phase of each test cycle, and is configured during the Mth test cycle to deassert the scan enable signal during the corresponding scan shift phase.

16. The system of claim 15, wherein the LBIST controller comprises: a clock control block configured to assert a first signal during the scan shift phase of each test cycle; a state machine control block configured to assert a second signal during the M−1 LBIST test cycles and to deassert the second signal during the Mth LBIST test cycle; and an AND gate configured to receive the first and second signals and to assert the scan enable signal only when both the first and second signals are asserted.

17. The system of claim 10, further comprising: a second device which is configured identically to the first device, wherein the second device is known to operate properly; and control circuitry coupled to the first and second devices and configured to compare data generated by the first device to data generated by the second device to determine whether errors occurred in data generated by the first device.

* * * * *